US010312306B2

(12) United States Patent
Kim et al.

(10) Patent No.: US 10,312,306 B2
(45) Date of Patent: Jun. 4, 2019

(54) ORGANIC LIGHT EMITTING DIODE DISPLAY DEVICE

(71) Applicant: SAMSUNG DISPLAY CO., LTD., Yongin-si, Gyeonggi-do (KR)

(72) Inventors: Heejin Kim, Yongin-si (KR); Youngsun Hwang, Yongin-si (KR)

(73) Assignee: Samsung Display Co., Ltd., Yongin-Si, Gyeonggi-do (KR)

( * ) Notice: Subject to any disclaimer, the term of this patent is extended or adjusted under 35 U.S.C. 154(b) by 0 days.

(21) Appl. No.: 15/837,584

(22) Filed: Dec. 11, 2017

(65) Prior Publication Data

US 2018/0166519 A1 Jun. 14, 2018

(30) Foreign Application Priority Data

Dec. 12, 2016 (KR) .................. 10-2016-0168657

(51) Int. Cl.
*H01L 29/08* (2006.01)
*H01L 27/32* (2006.01)
*H01L 51/50* (2006.01)
*H01L 51/52* (2006.01)
*H01L 51/00* (2006.01)

(52) U.S. Cl.
CPC ...... *H01L 27/3246* (2013.01); *H01L 51/0045* (2013.01); *H01L 51/5044* (2013.01); *H01L 51/5284* (2013.01); *H01L 27/322* (2013.01); *H01L 51/508* (2013.01); *H01L 51/5064* (2013.01); *H01L 51/5253* (2013.01); *H01L 51/5278* (2013.01); *H01L 2251/5369* (2013.01)

(58) Field of Classification Search
CPC .................................................. H01L 27/3246
USPC ............................................................ 257/40
See application file for complete search history.

(56) References Cited

U.S. PATENT DOCUMENTS

| | | | |
|---|---|---|---|
| 8,969,855 B2 | 3/2015 | Kwak | |
| 2013/0153867 A1* | 6/2013 | Seo | H01L 51/0054 257/40 |
| 2014/0367646 A1* | 12/2014 | Kim | H01L 27/3246 257/40 |
| 2015/0218001 A1* | 8/2015 | Wang | C01B 31/02 424/9.6 |
| 2016/0155975 A1 | 6/2016 | Jin et al. | |
| 2016/0231615 A1* | 8/2016 | Nam | G02F 1/133512 |
| 2018/0138411 A1* | 5/2018 | Hung | H01L 27/3246 |

FOREIGN PATENT DOCUMENTS

| | | |
|---|---|---|
| KR | 10-0810645 B1 | 2/2008 |
| KR | 10-2013-0061493 A | 6/2013 |
| KR | 10-2016-0050700 A | 5/2016 |
| KR | 10-2016-0065553 A | 6/2016 |

* cited by examiner

*Primary Examiner* — Ajay Arora
(74) *Attorney, Agent, or Firm* — Lee & Morse, P.C.

(57) ABSTRACT

An organic light emitting display device is capable of substantially preventing the occurrence of color mixture and improve the color purity, the organic light emitting display device including: a substrate; a first electrode on the substrate; a pixel defining layer defining a first opening which exposes at least a portion of the first electrode; a first organic light emission layer on the first electrode; and a second electrode on the first organic light emission layer, wherein the pixel defining layer may include quantum dots.

20 Claims, 9 Drawing Sheets

ORGANIC LIGHT EMITTING DIODE DISPLAY DEVICE

CROSS-REFERENCE TO RELATED APPLICATION

Korean Patent Application No. 10-2016-0168657, filed on Dec. 12, 2016, and entitled, "Organic Light Emitting Diode Display Device," is incorporated by reference herein in its entirety.

BACKGROUND

1. Field

One or more embodiments described herein relate to an organic light emitting diode display device.

2. Description of the Related Art

A variety of displays have been developed. Examples include liquid crystal displays, organic light emitting diode (OLED) displays, plasma display panels, and electrophoretic displays. Among these, OLED displays have improved contrast ratio and response time and are easy to be implement as flexible display devices.

An OLED display may have a structure in which a cathode and an anode surround several layers of thin films, including organic materials, on a substrate. When voltages are applied to the cathode and anode, current flows in one or more of the organic thin films to cause light emission, e.g., organic molecules are excited by the current and then return to ground state, whereupon light is emitted.

The distance between pixels decreases as the resolution of an OLED display increases. Various adverse effects may occur as a result. For example, color mixture may occur between pixel areas.

SUMMARY

In accordance with one or more embodiments, an organic light emitting display device includes a substrate; a first electrode on the substrate; a pixel defining layer defining a first opening that exposes at least a portion of the first electrode; a first organic light emission layer on the first electrode; and a second electrode on the first organic light emission layer, wherein the pixel defining layer includes quantum dots. The quantum dots may be carbon quantum dots.

The pixel defining layer may include a first pixel defining layer and a second pixel defining layer, the first pixel defining layer and the second pixel defining layer defining the first opening together, and the first pixel defining layer may have a second opening. At least a portion of the second pixel defining layer may be at the second opening. The first pixel defining layer may include the quantum dots, and the second pixel defining layer may exclude the quantum dots. The quantum dots may be carbon quantum dots.

The organic light emitting display device may include at least one of a hole injection layer and a hole transport layer between the first electrode and the first organic light emission layer. The organic light emitting display device may include an auxiliary hole transport layer between the first electrode and the first organic light emission layer. The organic light emitting display device may include at least one of an electron transport layer and an electron injection layer between the first organic light emission layer and the second electrode.

The organic light emitting display device may include an auxiliary electron transport layer between the first organic light emission layer and the second electrode. The organic light emitting display device may include a capping layer on the second electrode; and a thin film encapsulation layer on the capping layer and including: at least one inorganic layer; and at least one organic layer alternately arranged with the at least one inorganic layer. The organic light emitting display device may include a capping layer on the second electrode; a filler on the capping layer; and an encapsulation substrate on the filler.

The organic light emitting display device may include a second organic light emission layer between the first organic light emission layer and the second electrode. One of the first organic light emission layer and the second organic light emission layer may be a blue light emission layer, and the other of the first organic light emission layer and the second organic light emission layer may be a yellow light emission layer.

The organic light emitting display device may include a charge generation layer between the first organic light emission layer and the second organic light emission layer. The charge generation layer may include at least one of an n-type layer and a p-type layer.

In accordance with one or more other embodiments, a display device includes a substrate; a first electrode and a second electrode on the substrate; an organic emission layer between the first and second electrodes; and a pixel defining layer adjacent to the organic emission layer, wherein the pixel defining layer is between the substrate and the second electrode and wherein the pixel defining layer includes quantum dots. The quantum dots may include a light-absorbing material. Each of the quantum dots may include carbon. The display device may include a capping layer on the second electrode; an encapsulation substrate; and a filler between the capping layer and the encapsulation layer.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments are described with reference to the drawings; however, they may be embodied in different forms and should not be construed as limited to the embodiments set forth herein. Rather, these embodiments are provided so that this disclosure will be thorough and complete, and will convey exemplary implementations to those skilled in the art. The embodiments (or portions thereof) may be combined to form additional embodiments In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "lower", "above", "upper" and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "including," "includes" and/or "including," when used in this specification, specify the presence of stated features, integers, steps, operations, elements and/or components, but do not preclude the presence or addition of one or more other features, integers, steps, operations, elements, components and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About," "approximately," or "substantially," as used herein is inclusive of the stated value and means within an acceptable range of deviation for the particular value as determined by one of ordinary skill in the art, considering the measurement in question and the error associated with measurement of the particular quantity (e.g., the limitations or tolerances of the measurement system). For example, "about," "approximately," or "substantially," may mean within one or more standard deviations, or within ±30%, 20%, 10%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Figure 1:
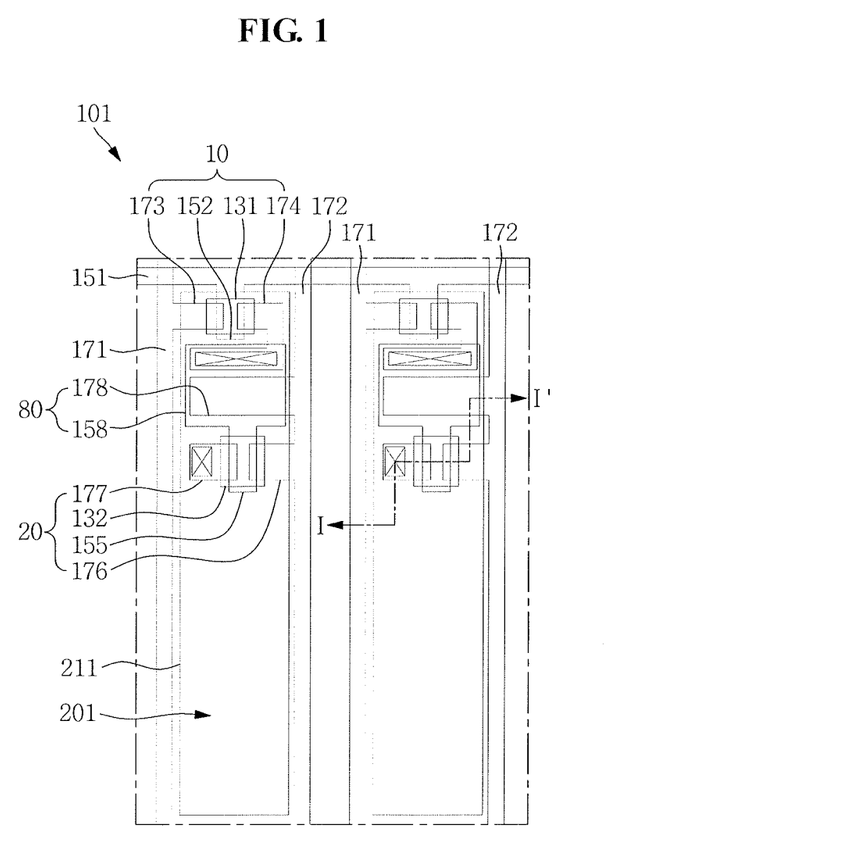
FIG. 1 illustrates an embodiment of an OLED display device.
Figure 2:
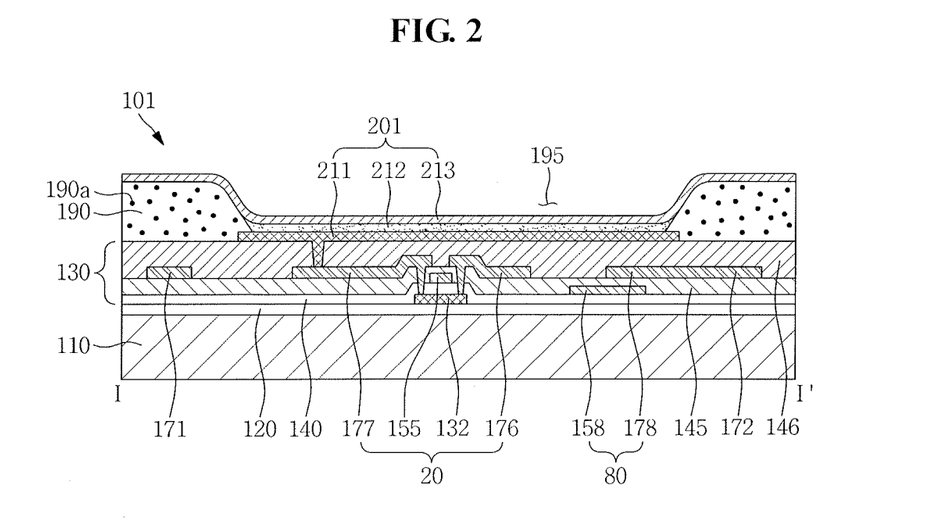
FIG. 2 illustrates a cross-sectional view taken along line I-I' in FIG. 1.
Figure 3A:
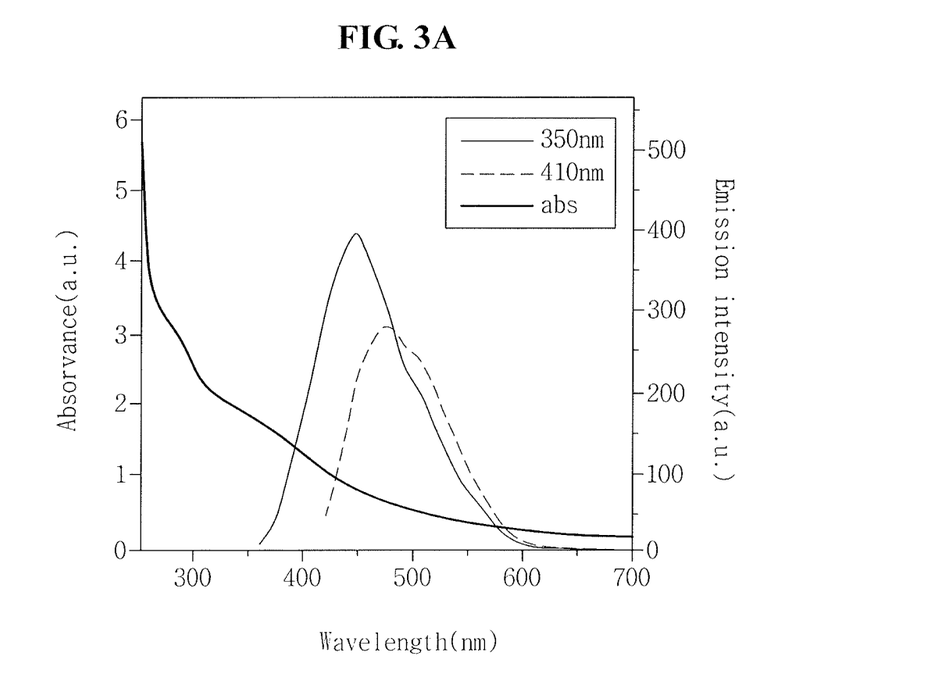
FIGS. 3A and 3B illustrate examples of an absorption spectrum and an emission spectrum of carbon quantum dots.
Figure 3B:
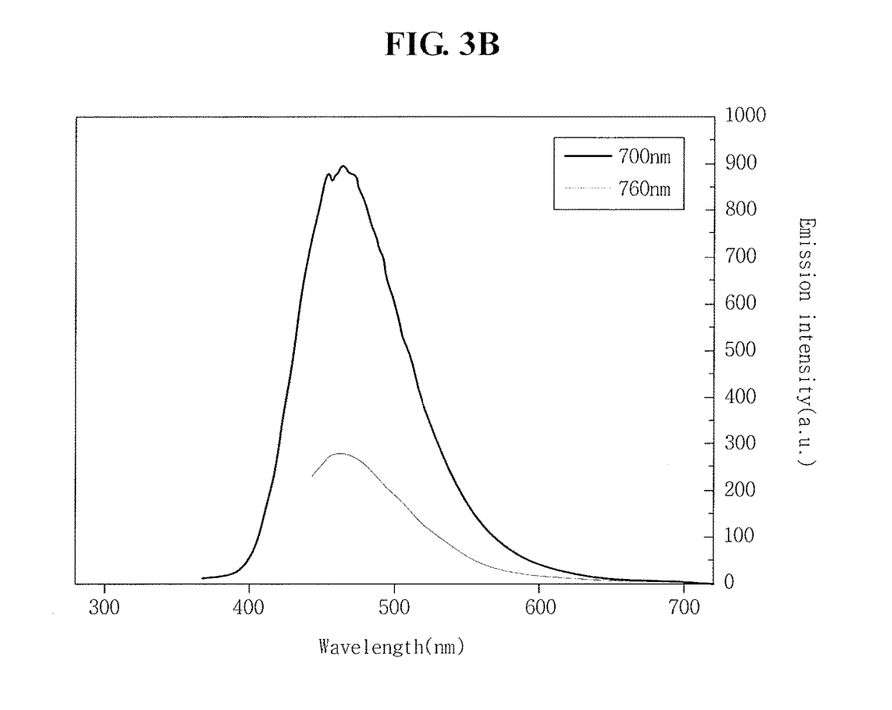

FIG. 1 illustrates an embodiment of an OLED display device 101, FIG. 2 illustrates a cross-sectional view taken along line I-I' in FIG. 1, and FIGS. 3A and 3B illustrate examples of an absorption spectrum and an emission spectrum of carbon quantum dots.

Referring to FIGS. 1 and 2, the OLED display device 101 includes a substrate 110, a wiring portion 130, and an OLED 201. The substrate 110 may include glass, quartz, ceramic, plastic, or another insulating material. In one embodiment, the substrate 110 may include a metallic material such as but not limited to stainless steel.

A buffer layer 120 is on the substrate 110 and may include one or more inorganic and/or organic layers. The buffer layer 120 serves to substantially prevent permeation of undesirable elements, such as moisture, into the wiring portion 130 or the OLED 201, and to planarize a surface therebelow. In one embodiment, the buffer layer 120 may be omitted, for example, depending on the kind of the substrate 110 and process conditions.

The wiring portion 130 is on the buffer layer 120 and may correspond to one or more layers that include, for example, a switching thin film transistor ("TFT") 10, a driving TFT 20, and a capacitor 80 for driving the OLED 201. The OLED 201 emits light based on a driving signal from the wiring portion 130 to display an image.

FIGS. 1 and 2 illustrate an active matrix-type organic light emitting diode (AMOLED) display device 101 having a 2Tr-1Cap structure. The 2Tr-1Cap structure may include, for example, two TFTs (e.g., the switching TFT 10 and the driving TFT 20) and one capacitor 80 in each pixel. The OLED display device 101 may be another type of display device and/or may have a different structure in another embodiment. For example, the OLED display device 101 may include three or more TFTs and two or more capacitors in each pixel and may have various structures with additional wirings. In at least one embodiment, a pixel may refer to a smallest unit for emitting light, and the OLED display device 101 may display an image based on light emitted from a plurality of pixels.

Each pixel PX includes the switching TFT 10, the driving TFT 20, the capacitor 80, and the OLED 201. A gate line 151 may extend along one direction, and a data line 171 and a common power line 172 may be insulated from and intersect the gate line 151. These features may also be provided at the wiring portion 130. In one embodiment, boundaries of each pixel PX may be set based on the positions of the gate line 151, the data line 171, and the common power line 172. The pixels PX may be defined by a pixel defining layer 190 or a black matrix.

The OLED 201 includes a plurality of first electrodes 211 on the substrate 110, an organic light emission layer 212 on the first electrode 211, and a second electrode 213 on the organic light emission layer 212. Holes and electrons are injected into the organic light emission layer 212 from the plurality of first electrodes 211 and the second electrode 213, respectively, and combined therein to form excitons. The OLED 201 emits light when the excitons fall from an excited state to a ground state.

The capacitor 80 includes a pair of capacitor plates 158 and 178, with an insulating interlayer 145 therebetween. In such an exemplary embodiment, the insulating interlayer 145 may be a dielectric element. The capacitance of the capacitor 80 may be determined by electric charges accumulated in the capacitor 80 and a voltage across the pair of capacitor plates 158 and 178.

The switching TFT 10 includes a switching semiconductor layer 131, a switching gate electrode 152, a switching source electrode 173, and a switching drain electrode 174. The driving TFT 20 includes a driving semiconductor layer 132, a driving gate electrode 155, a driving source electrode 176, and a driving drain electrode 177. A gate insulating layer 140 may further be provided to insulate the semiconductor layers 131 and 132 and the gate electrodes 152 and 155.

The switching TFT 10 may function as a switching element which selects a pixel to perform light emission. The switching gate electrode 152 is connected to the gate line 151, and the switching source electrode 173 is connected to the data line 171. The switching drain electrode 174 is spaced apart from the switching source electrode 173 and is connected to one of the capacitor plates, e.g., the capacitor plate 158.

The driving TFT 20 applies a driving power to the first electrode 211 which is a pixel electrode. The driving power allows the organic light emission layer 212 of the OLED 201 in a selected pixel to emit light. The driving gate electrode 155 is connected to the one capacitor plate 158 that is connected to the switching drain electrode 174. Each of the driving source electrode 176 and the other of the capacitor plates (e.g., capacitor plate 178) is connected to the common power line 172. The driving drain electrode 177 is connected to the first electrode 211 of the OLED 201 through a contact hole.

The switching TFT 10 is driven, based on a gate voltage applied to the gate line 151, to transmit a data voltage applied to the data line 171 to the driving TFT 20. A voltage is stored in the capacitor 80 and is equivalent to a difference between a common voltage applied to the driving TFT 20 from the common power line 172 and the data voltage transmitted by (or from) the switching TFT 10. A current corresponding to the voltage stored in the capacitor 80 flows to the OLED 201 through the driving TFT 20, and the OLED 201 emits light.

In an exemplary embodiment, the first electrode 211 is an anode for injecting holes and the second electrode 213 is a cathode for injecting electrons. In one embodiment, the first electrode 211 may be a cathode and the second electrode 213 may be an anode.

A planarization layer 146 is on the insulating interlayer 145 and includes an insulating material to protect the wiring portion 130. The planarization layer 146 and the insulating interlayer 145 may include substantially a same material.

The drain electrode 177 of the driving TFT 20 is connected to the first electrode 211 of the OLED 201 through a contact hole defined in the planarization layer 146.

According to an exemplary embodiment, the first electrode 211 is a reflective electrode and the second electrode 213 is a transflective electrode. Accordingly, light generated in the organic light emission layer 212 is emitted through the second electrode 213. For example, according to an exemplary embodiment the OLED display device 101 may be a top-emission type structure.

One or more metals of magnesium (Mg), silver (Ag), gold (Au), calcium (Ca), lithium (Li), chromium (Cr), aluminum (Al), copper (Cu), and an alloy thereof may be used to form the reflective electrode and the transflective electrode.

For example, the first electrode 211 may include a transparent conductive layer on a reflective layer. The reflective layer may include, for example, one or more metals of magnesium (Mg), silver (Ag), gold (Au), calcium (Ca), lithium (Li), chromium (Cr), aluminum (Al), copper (Cu), and an alloy thereof. In such an exemplary embodiment, the transparent conductive layer may include a transparent conductive oxide (TCO). Examples of the TCO include indium tin oxide (ITO), indium zinc oxide (IZO), zinc oxide (ZnO), aluminum zinc oxide (AZO), and indium oxide ($In_2O_3$). Since such a transparent conductive layer has a high work function, hole injection through the first electrode 211 may be smoothly performed.

In addition, the first electrode 211 may have a triple-layer structure that includes a transparent conductive layer, a reflective layer, and a transparent conductive layer are sequentially stacked.

The second electrode 213 may include a transflective layer, for example, made of one or more metals of magnesium (Mg), silver (Ag), gold (Au), calcium (Ca), lithium (Li), chromium (Cr), aluminum (Al), copper (Cu), and an alloy thereof. Light transmittance may increase as the thickness of the transflective electrode decreases. On the other hand, light transmittance may decrease as the thickness of the transflective electrode increases.

The organic light emission layer 212 may include a monomer organic material or a polymer organic material. The organic light emission layer 212 may be formed by various methods using, for example, an organic light emitting material.

The pixel defining layer 190 is between the plurality of first electrodes 211. In one embodiment, the pixel defining layer 190 may define a first opening 195 that exposes at least a portion of the first electrode 211. The first electrode 211, the organic light emission layer 212, and the second electrode 213 are stacked sequentially at the first opening 195 of the pixel defining layer 190. The second electrode 213 is not only on the organic light emission layer 212 but also on the pixel defining layer 190. The OLED 201 generates light in the organic light emission layer 212 at the first opening 195 of the pixel defining layer 190. The light emission area may be defined, for example, by the pixel defining layer 190.

The pixel defining layer 190 includes quantum dots, which, for example, may be carbon quantum dots 190a. The carbon quantum dots 190a may be nano-sized particles that include carbon as the main component. The carbon quantum dots 190a may also be referred to as carbon nanoparticles or graphene oxide nanoparticles.

The carbon quantum dots 190a may be synthesized, for example, through decomposition, carbonization, and crystallization of an organic material under specific temperature and pressure. In such an exemplary embodiment, a hydrothermal method or a solvothermal method may be used to provide specific temperature and pressure. The hydrothermal method is a synthesis method in which a sealed container containing water is heated to produce a temperature and a pressure. The solvothermal method is a synthesis method in which a sealed container containing an organic solvent such as alcohol and benzene is heated to produce a temperature and a pressure.

The carbon quantum dots 190a may be generated, for example, by decomposing and promoting an organic material using an oxidizing agent, a reducing agent, a catalyst, and the like. In such an exemplary embodiment, an oxidizing agent, a reducing agent, or a catalyst may be used as a promoter. Examples of an oxidizing agent that may be used as a promoter include nitric acid, sulfuric acid, hydrogen peroxide, and potassium permanganate. Examples of a reducing agent that may be used as a promoter include $NaBH_4$, potassium borohydride ($KBH_4$), $LiAlH_4$, and $N_2H_4$. Examples of a catalyst that may be used as a promoter include platinum, Pd, Ni, $TiO_2$, and $Fe_2O_3$.

The carbon quantum dots 190a may be synthesized using, for example, organic compounds that include organic elements extracted from plants and animal fatty acids. For example, the carbon quantum dots 190a may be synthesized using organic elements extracted from plants such as white sugar, starch, ascorbic acid, glucose, tartaric acid, citric acid, or the like. In one embodiment, the carbon quantum dots 190a may be synthesized using fatty acids such as oleic acid, amino acid (e.g., glutamine), benzene, acetylacetone, acetophenone ($C_6H_5C(O)CH_3$), or acetic acid.

Referring to FIGS. 3A and 3B, the carbon quantum dots 190a include carbon as a main component in order to absorb light. The carbon quantum dots 190a absorb light incident to the carbon quantum dots 190a, and then emit light of a wavelength different from the wavelength of the incident light. The carbon quantum dots 190a may change the wavelength of light, for example, through both absorption and fluorescence.

FIG. 3A illustrates an example of an absorption spectrum (abs) of the carbon quantum dots 190a and an emission spectrum when light at a wavelength of about 350 nm and light at a wavelength of about 410 nm are incident to the carbon quantum dots 190a. In such an exemplary embodiment, the carbon quantum dots 190a absorb light in an entire wavelength range of the visible light, and an absorbance of the carbon quantum dots 190a increases as the wavelength is shortened. In addition, the carbon quantum dots 190a may emit a light of a wavelength longer than a wavelength of the incident light.

FIG. 3B illustrates an example of an emission spectrum when light at a wavelength of about 700 nm and light at a wavelength of about 760 nm are incident to the carbon quantum dots 190a. In such an exemplary embodiment, the carbon quantum dots 190a may emit light at a wavelength shorter than a wavelength of the incident light.

For example, the wavelength of light to be converted by the carbon quantum dots 190a may vary depending, for example, on the size of the carbon quantum dots 190a. Accordingly, light of a specific color may be emitted from the carbon quantum dots 190a by controlling the diameter of the carbon quantum dots 190a.

In one embodiment, a plurality of pixels may emit one of various colors of light, e.g., red light, green light, and blue light. A pixel emitting a red light may be referred to as a red pixel. A pixel emitting green light may be referred to as a green pixel. A pixel emitting blue light, and a referred to as a blue pixel. The pixel defining layer 190 adjacent to the red pixel may include carbon quantum dots 190a emitting red light. The pixel defining layer 190 adjacent to the green pixel may include carbon quantum dots 190a emitting green light. The pixel defining layer 190 adjacent to the blue pixel may include carbon quantum dots 190a emitting blue light.

By including the quantum dots 190a, the pixel defining layer 190 may absorb a portion of light incident to the pixel defining layer 190 and convert the wavelength of another portion of light incident to the pixel defining layer 190 to emit light of a desired color. Accordingly, the pixel defining layer 190 may substantially prevent color mixture from occurring between multiple (e.g., adjacent) pixels. In addition, the pixel defining layer 190 may improve color purity of the OLED display device 101 by emitting light of a color that is substantially the same as the color of a pixel adjacent to the pixel defining layer 190.

Figure 4:
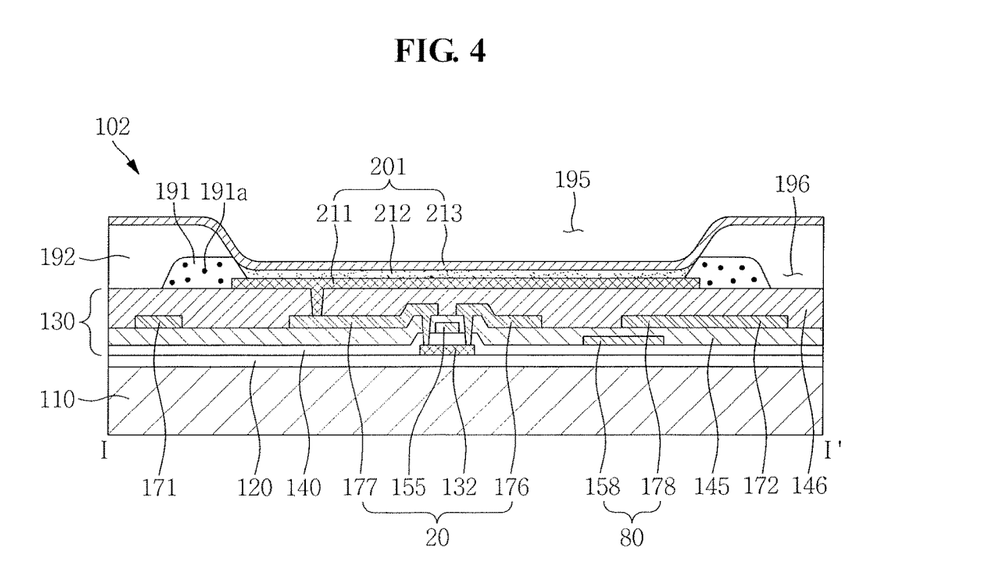
FIG. 4 illustrates another embodiment of an OLED display device.

FIG. 4 illustrates a cross-sectional view of another embodiment of an OLED display device 102. Referring to FIG. 4, an OLED display device 102 includes a first pixel defining layer 191 and a second pixel defining layer 192 between a plurality of first electrodes 211. The first and second pixel defining layers 191 and 192 may define, for example, a first opening 195 which exposes at least a portion of the first electrode 211.

The first pixel defining layer 191 is on a planarization layer 146 and contacts the plurality of first electrodes 211. In such an exemplary embodiment, the first pixel defining layer 191 has a second opening 196 which exposes at least a portion of the planarization layer 146. The second pixel defining layer 192 is on the first pixel defining layer 191 and the planarization layer 146. At least a portion of the second pixel defining layer 192 may be at the second opening 196 of the first pixel defining layer 191.

The first pixel defining layer 191 includes carbon quantum dots 191a and the second pixel defining layer 192 does not include the carbon quantum dots 191a. For example, the pixel defining layer may include the carbon quantum dots 191a only at a portion of the pixel defining layer that is adjacent to each pixel. Accordingly, color mixture between the plurality of pixels may be substantially prevented and color purity of the OLED display device 101 may be improved.

Figure 5:
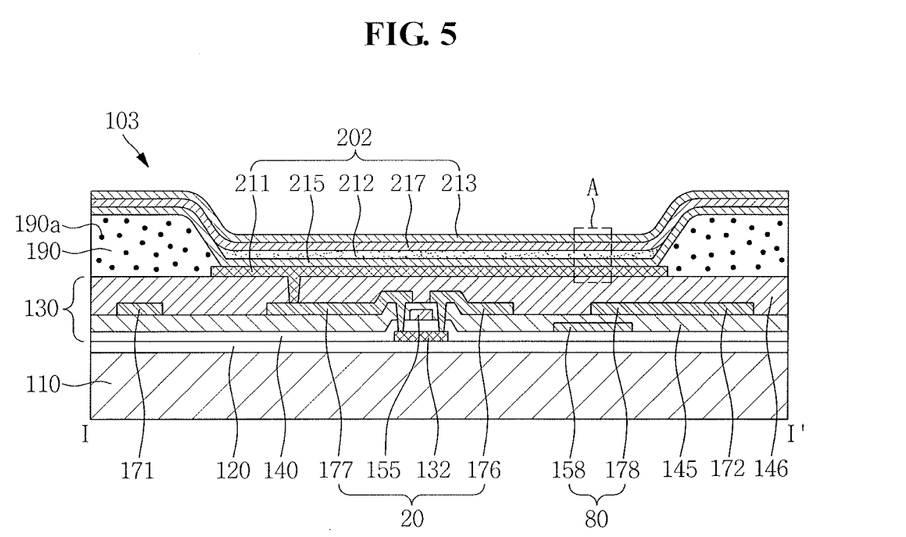
FIG. 5 illustrates another embodiment of an OLED display device.
Figure 6:
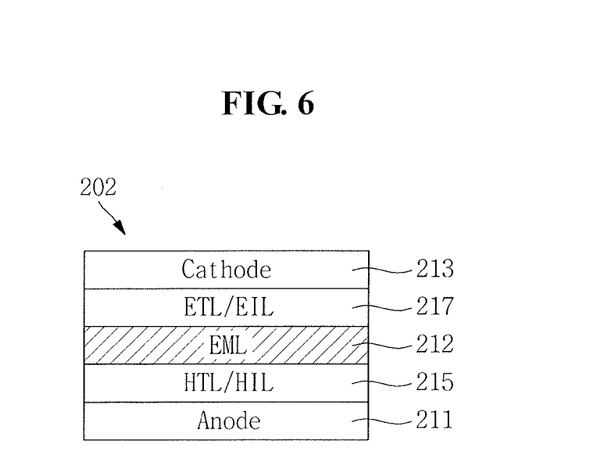
FIG. 6 illustrates an embodiment of area A in FIG. 5.

FIG. 5 illustrates another embodiment of an OLED display device 103, and FIG. 6 illustrates an enlarged cross-sectional view of an embodiment of area A in FIG. 5.

Referring to FIGS. 5 and 6, the OLED display device 103 includes a substrate 110, a wiring portion 130, and an OLED 202. The OLED 202 may include a first auxiliary light emission layer 215 between the first electrode 211 and the organic light emission layer 212, and a second auxiliary light emission layer 217 between the organic light emission layer 212 and the second electrode 213.

The first auxiliary light emission layer 215 may include at least one of a hole injection layer HIL and a hole transport layer HTL. In one embodiment, the first auxiliary light emission layer 215 may include the hole injection layer HIL and the hole transport layer HTL.

The second auxiliary light emission layer 217 may include at least one of an electron transport layer ETL and an electron injection layer EIL. In one embodiment, the second auxiliary light emission layer 217 may include the electron injection layer EIL and the electron transport layer ETL. The first auxiliary light emission layer 215 and the second auxiliary light emission layer 217 may extend between the pixel defining layer 190 and the second electrode 213.

The organic light emission layer 212, the hole injection layer HIL, the hole transport layer HTL, the electron transport layer ETL, and the electron injection layer EIL include organic materials, and thus may be referred to as organic layers. The organic layer may include, for example, a low molecular weight organic material or a high molecular weight organic material.

In one embodiment, the OLED 202 may include only one of the first auxiliary light emission layer 215 and the second auxiliary light emission layer 217, or may include both the first auxiliary light emission layer 215 and the second auxiliary light emission layer 217.

Figure 7:
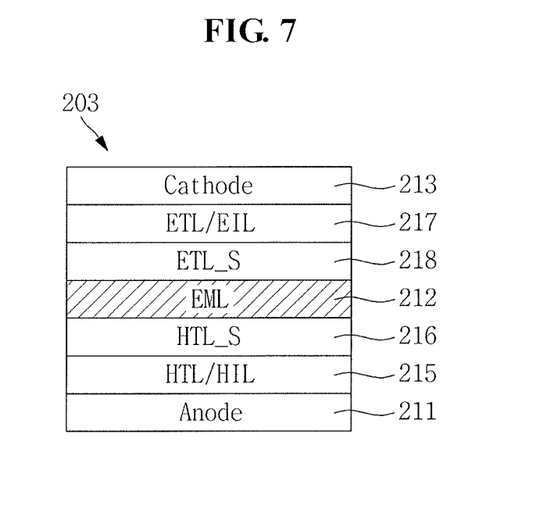
FIG. 7 illustrates another embodiment of an OLED display device.

FIG. 7 illustrates another embodiment of area A in FIG. 5. Referring to FIG. 7, an OLED 203 may further include a plurality of first auxiliary light emission layers 215 and 216 between a first electrode 211 and an organic light emission layer 212, and a plurality of second auxiliary light emission layers 217 and 218 between the organic light emission layer 212 and a second electrode 213.

One of the first auxiliary light emission layers 215 and 216 (e.g., first auxiliary light emission layer 215) may include at least one of a hole injection layer HIL and a hole transport layer HTL. In one embodiment, said one of the first auxiliary light emission layers 215 may include the hole injection layer HIL and the hole transport layer HTL.

The other of the first auxiliary light emission layers 215 and 216 (e.g., first auxiliary light emission layer 216) may be an auxiliary hole transport layer HTL_S. The auxiliary hole transport layer HTL_S may include a compound having excellent hole transporting properties so as to reduce a HOMO energy level difference between the hole transport layer HTL and the organic light emission layer 212. Accordingly, hole accumulation may be substantially prevented at an interface between the auxiliary hole transport layer HTL_S and the organic light emission layer 212, thereby reducing a quenching phenomenon in which excitons disappear at the interface.

One of the second auxiliary light emission layers 217 and 218 (e.g., second auxiliary light emission layer 217) may include at least one of an electron injection layer EIL and an electron transport layer ETL. In one embodiment, said one of the plurality of second auxiliary light emission layers 217 may include the electron injection layer EIL and the electron transport layer ETL.

The other of the second auxiliary light emission layers 217 and 218 (e.g., second auxiliary light emission layer 218) may be an auxiliary electron transport layer ETL_S. The auxiliary electron transport layer ETL_S may reduce an energy of the holes or excitons transferred from the organic light emission layer 212, thereby substantially reducing or minimizing the influence of the holes or excitons transferred from the organic light emission layer 212 to the electron transport layer ETL.

In such an exemplary embodiment, the OLED 203 may include a portion of the first auxiliary light emission layers 215 and 216 and the second auxiliary light emission layers 217 and 218, or may include both the first auxiliary light emission layers 215 and 216 and the second auxiliary light emission layers 217 and 218. In one embodiment, the OLED 203 may further include the auxiliary hole transport layer HTL_S and the auxiliary electron transport layer ETL_S. With such a configuration, deterioration may be reduced and the efficiency and lifetime may be improved.

Figure 8:
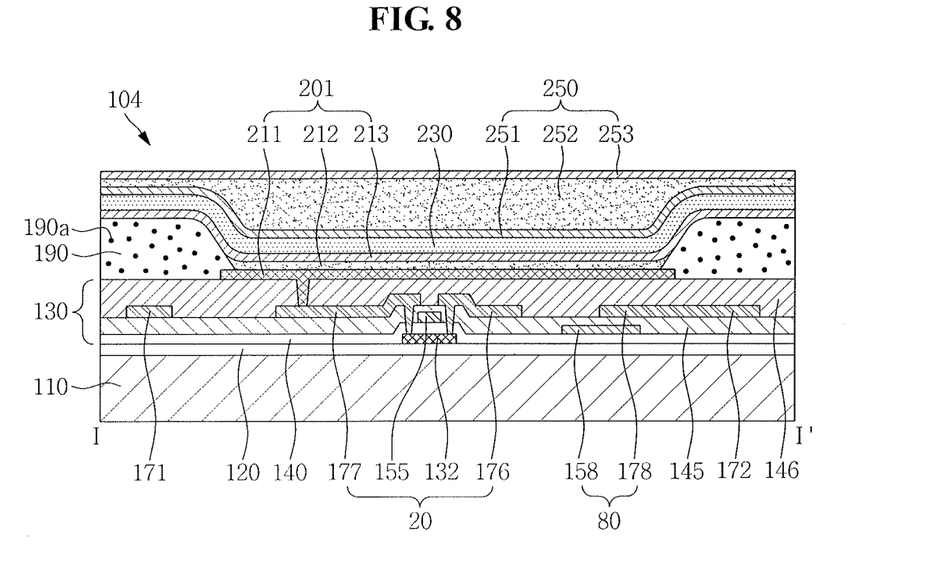
FIG. 8 illustrates another embodiment of an OLED display device.

FIG. 8 illustrates another embodiment of an OLED display device 104 which further includes a capping layer 230 and a thin film encapsulation layer 250 on an OLED 201. The capping layer 230 serves to protect the OLED 201 and also allows light emitted from an organic light emission layer 212 to be efficiently emitted toward the outside.

The capping layer 230 may include at least one of inorganic materials and organic materials having light transmittance. For example, the capping layer 230 may include an inorganic layer or an organic layer. In one embodiment, the capping layer 230 may include an organic layer including inorganic particles.

In one embodiment, the capping layer 230 may include two or more materials having different refractive indices. For example, the capping layer 230 may be formed using a mixture of a high refractive index material and a low refractive index material. The high refractive index material and the low refractive index material may be organic or inorganic materials.

The capping layer 230 may have a thickness in a predetermined range, e.g., from about 30 nm to about 300 nm. In one embodiment, the capping layer 230 may have a thickness of about 300 nm or more. As the thickness of the capping layer 230 increases, it may be more advantageous to protect the OLED 201. However, when the capping layer 230 is relatively thick, it may be disadvantageous to slim down the OLED display device 104.

The thin film encapsulation layer 250 includes one or more inorganic layers 251 and 253 and one or more organic layers 252. For example, the thin film encapsulation layer 250 includes at least one inorganic layer 251 and 253 and at least one organic layer 252 which is alternately stacked with the at least one inorganic layer 251 and 253. According to one exemplary embodiment, the thin film encapsulation layer 250 may include two inorganic layers 251 and 253 and one organic layer 252.

The inorganic layers 251 and 253 may include one or more inorganic materials. Examples of the inorganic materials include $Al_2O_3$, $TiO_2$, $ZrO$, $SiO_2$, AlON, AlN, SiON, $Si_3N_4$, ZnO, and $Ta_2O_5$. The inorganic layers 251 and 253 may be formed through methods such as but not limited to chemical vapor deposition (CVD) method, atomic layer deposition (ALD) method, or another method.

The organic layer 252 may include a polymer-based material. Examples of the polymer-based material include an acrylic resin, an epoxy resin, polyimide and polyethylene. The organic layer 252 may be formed, for example, through a thermal deposition process. The thermal deposition process may be performed in a temperature range that does not result in damage to the OLED 201.

The inorganic layers 251 and 253 may have a high thin film density which substantially prevents or efficiently reduces infiltration of, mostly, moisture or oxygen. Permeation of moisture and oxygen into the OLED 201 may be largely prevented by the inorganic layers 251 and 253.

Moisture and oxygen that passes through the inorganic layers 251 and 253 may be blocked by the organic layer 252. The organic layer 252 may also serve as a buffer layer to reduce stress on the inorganic layers 251 and 253, in addition to performing the moisture infiltration preventing function. Further, since the organic layer 252 has planarizaing characteristics, an uppermost surface of the thin film encapsulation layer 250 may be planarized by the organic layer 252.

The thin film encapsulation layer 250 may have a thickness in a predetermined range, e.g., less than or equal to about 10 µm. Accordingly, the OLED display device 104 may have a small thickness and flexible characteristics.

Figure 9:
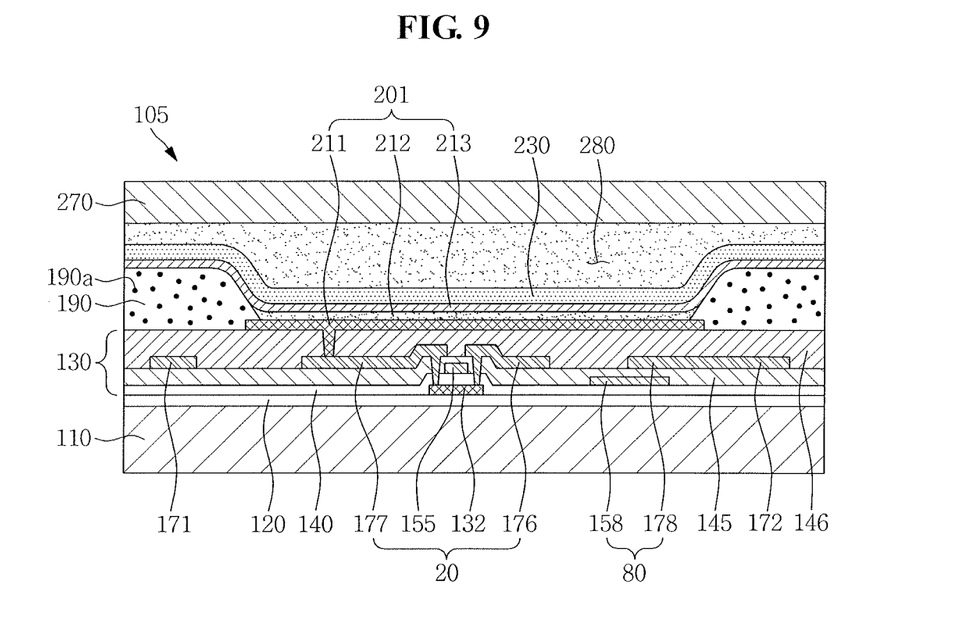
FIG. 9 illustrates another embodiment of an OLED display device.

FIG. 9 illustrates another embodiment of an OLED display device 105 which includes a capping layer 230 on an OLED 201, a filler 280 on the capping layer 230, and an encapsulation substrate 270 on the filler 280. The encapsulation substrate 270 is a transparent insulating substrate including, for example, glass, quartz, ceramic, or plastic. The encapsulation substrate 270 is sealingly attached to a substrate 110 to protect the OLED 201.

The filler 280 may include an organic material, for example, a polymer. The filler 280 may have a refractive index greater than or less than a refractive index of the capping layer 230. In one embodiment, the filler 280 may have a refractive index substantially equal to a refractive index of the capping layer 230.

The filler 280 may be selected according to the refractive indices of the capping layer 230 and the encapsulation substrate 270. For example, when the encapsulation substrate 270 is a glass substrate with a refractive index of about 1.5, a polymer having a refractive index of about 1.5 may be used as a material in the filler 280. An example of a material forming the filler 280 may include poly(methyl methacrylate) (PMMA).

Because the filler 280 fills a space between the capping layer 230 and the encapsulation substrate 270, the strength and durability of the OLED display device 105 may be improved.

Figure 10:
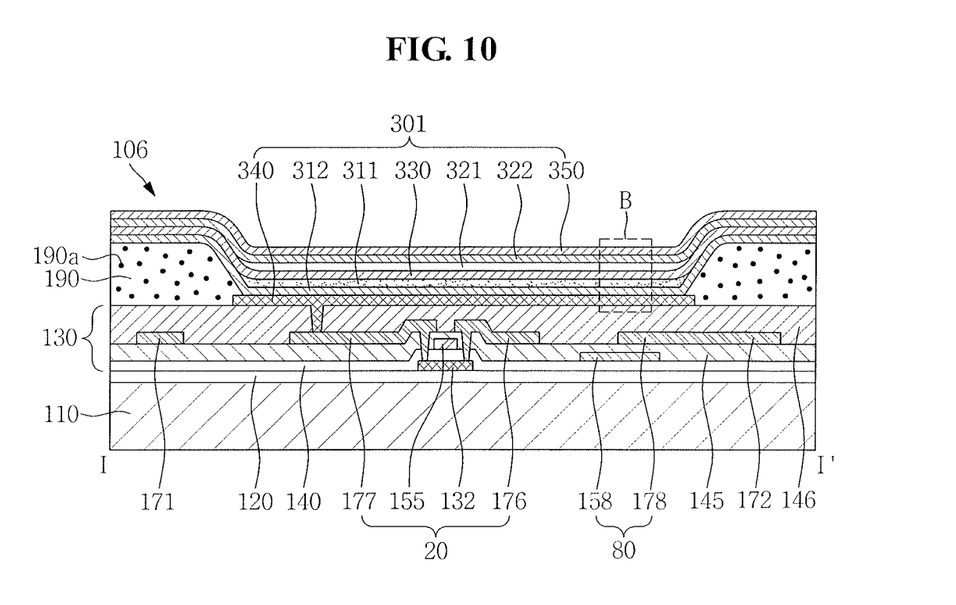
FIG. 10 illustrates another embodiment of an OLED display device.
Figure 11:
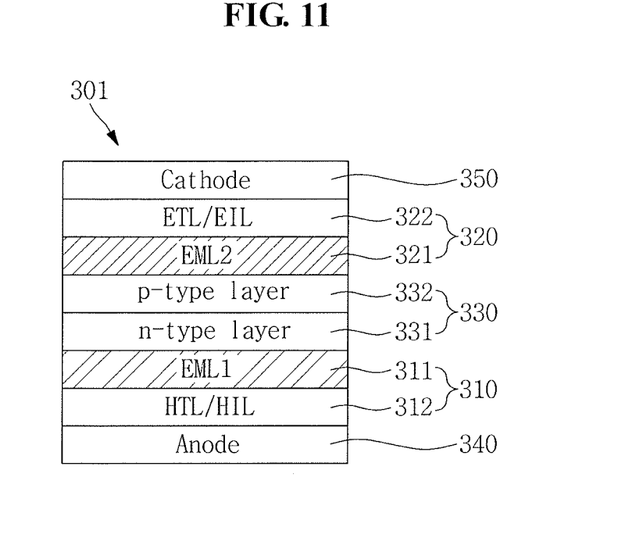
FIG. 11 illustrates an embodiment of area B in FIG. 10.

FIG. 10 illustrates another embodiment of an OLED display device 106, and FIG. 11 illustrates an embodiment of area B of FIG. 10. Referring to FIGS. 10 and 11, an OLED 301 of the OLED display device 106 includes two light emission units 310 and 320 connected in series.

The OLED 301 includes a first electrode 340 on a substrate 110, a first light emission unit 310 on the first electrode 340, a charge generation layer 330 on the first light emission unit 310, a second light emission unit 320 on the charge generation layer 330, and a second electrode 350 on the second light emission unit 320. The first light emission unit 310 includes a first organic light emission layer 311 between the first electrode 340 and the charge generation layer 330. The second light emission unit 320 includes a second organic light emission layer 321 between the charge generation layer 330 and the second electrode 350.

The OLED 301 has a tandem structure, in which the two light emission units 310 and 320 are connected in series. In such an exemplary embodiment, the first light emission unit 310 is adjacent to the first electrode 340 and the second light emission unit 320 is adjacent to the second electrode 350. In one embodiment, one of the first organic light emission layer 311 and the second organic light emission layer 321 may be a blue light emission layer and the other thereof may be a yellow light emission layer. For example, the OLED 301 may be a white organic light emitting diode (WOLED) which emits white light.

The first organic light emission layer 311 (EML1) illustrated in FIG. 11 may be a blue light emission layer. In such an exemplary embodiment, the first organic light emission layer 311 includes a blue light emitting material. The second organic light emission layer 321 (EML2) illustrated in FIG. 11 may be a yellow light emission layer. In such an exemplary embodiment, the second organic light emission layer 321 includes a yellow light emitting material. In one embodiment, the first organic light emission layer 311 may be a yellow light emission layer and the second organic light emission layer 321 may be a blue light emission layer.

The OLED 301 may further include a first auxiliary light emission layer 312 between the first electrode 340 and the first organic light emission layer 311. The first auxiliary light emission layer 312 may include at least one of a hole injection layer HIL and a hole transport layer HTL. In one embodiment, the first auxiliary light emission layer 312 may include the hole injection layer HIL and the hole transport layer HTL.

The OLED 301 may further include a second auxiliary light emission layer 322 between the second organic light emission layer 321 and the second electrode 350. The second auxiliary light emission layer 322 may include at least one of an electron transport layer ETL and an electron injection layer EIL. In one embodiment, the second auxiliary light emission layer 322 may include the electron injection layer EIL and the electron transport layer ETL.

The charge generation layer 330 is between the first light emission unit 310 and the second light emission unit 320. The charge generation layer 330 controls electric charges between the first light emission unit 310 and the second light emission unit 320, so that the electric charge balance between the first light emission unit 310 and the second light emission unit 320 may be achieved. The charge generation layer 330 includes an n-type layer 331 and a p-type layer 332. The n-type layer 331 is adjacent to the first light emission unit 310 and supplies electrons to the first light emission unit 310. The p-type layer 332 is adjacent to the second light emission unit 320 and supplies holes to the second light emission unit 320.

The charge generation layer 330 may include a metal such as aluminum (Al) or may include a transparent conductive material such as indium tin oxide (ITO).

The charge generation layer 330 may be formed, for example, by doping an organic material with an n-type material and a p-type material. In order to facilitate the supply of electrons, the n-type layer 331 may be formed, for example, by doping the organic material with the n-type material. In order to facilitate the supply of holes, the p-type layer 332 may be formed, for example, by doping the organic material with the p-type material.

When a voltage is applied between the first electrode 340 and the second electrode 350 of the OLED 301, electrons generated at the n-type layer 331 move to the first light emission unit 310, holes are injected to the first light emission unit 310 from the first electrode 340, and electrons and holes meet at the first light emission unit 310 to emit light. Electrons are injected to the second light emission unit 320 from the second electrode 350, holes generated at the p-type layer 332 move to the second light emission unit 320, and electrons and holes meet at the second light emission unit 320 to emit light.

A color filter may be on the second electrode 350 and overlap the OLED 301. In one embodiment, a red color filter, a green color filter, and a blue color filter may be independently arranged in the OLEDs 301, respectively. The OLED display device 106 may emit light of various colors, using the OLED 301 and the color filter.

Figure 12:
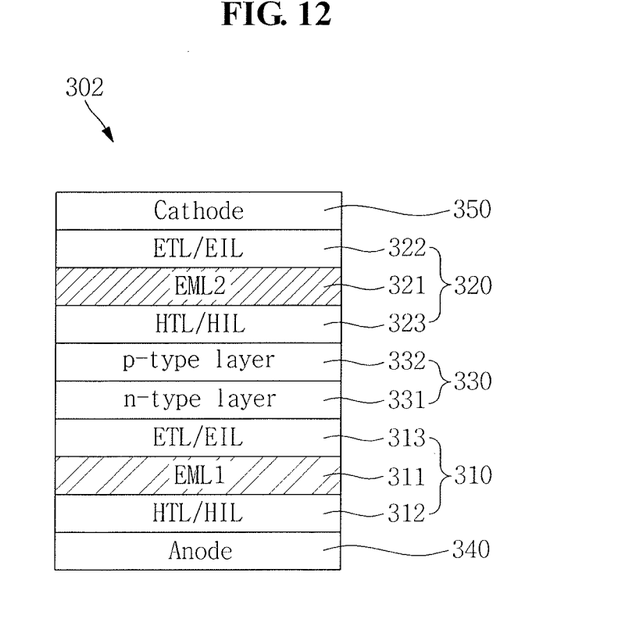
FIG. 12 illustrates another embodiment of area B in FIG. 10.

FIG. 12 illustrates another embodiment of area B of FIG. 10. Referring to FIG. 12, an OLED 302 includes a third auxiliary light emission layer 313 between a first organic light emission layer 311 and a charge generation layer 330. The third auxiliary light emission layer 313 may include one of an electron transport layer ETL and an electron injection layer EIL. In an exemplary embodiment, the third auxiliary light emission layer 313 may include the electron injection layer EIL and the electron transport layer ETL.

In addition, the OLED 302 may include a fourth auxiliary light emission layer 323 between the charge generation layer 330 and a second organic light emission layer 321. The fourth auxiliary light emission layer 323 may include one of a hole injection layer HIL and a hole transport layer HTL. In an exemplary embodiment, the fourth auxiliary light emission layer 323 may include the hole injection layer HIL and the hole transport layer HTL.

Since the OLED 302 includes the third auxiliary light emission layer 313 and the fourth auxiliary light emission layer 323, luminous efficiency of the first and second organic light emission layers 311 and 321 may be improved.

Figure 13:
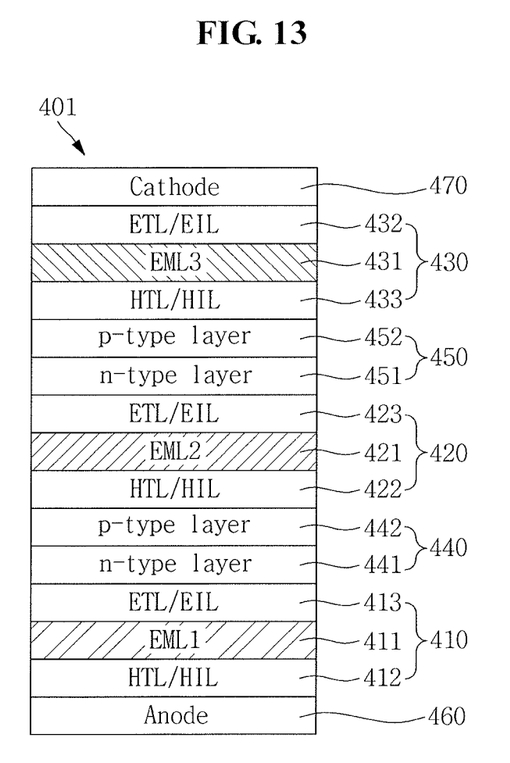
FIG. 13 illustrates another embodiment of area B in FIG. 10.

FIG. 13 illustrates another embodiment of area B of FIG. 10. Referring to FIG. 13, an OLED 401 includes three light emission units 410, 420 and 430 arranged in series and two charge generation layers 440 and 450 between respective pairs of the light emission units 410, 420 and 430.

The OLED 401 includes a first electrode 460, a first light emission unit 410, a first charge generation layer 440, a second light emission unit 420, a second charge generation layer 450, a third light emission unit 430, and a second electrode 470 that are sequentially disposed.

The first light emission unit 410 includes a first auxiliary light emission layer 412, a first organic light emission layer (EML1) 411, and a second auxiliary light emission layer 413. The second light emission unit 420 includes a third auxiliary light emission layer 422, a second organic light emission layer (EML2) 421, and a fourth auxiliary light emission layer 423. The third light emission unit 430 includes a fifth auxiliary light emission layer 433, a third organic light emission layer (EML3) 431, and a sixth auxiliary light emission layer 432.

The first, third, and fifth auxiliary light emission layers 412, 422, and 433 may include one of a hole injection layer HIL and a hole transport layer HTL or may include the hole injection layer HIL and the hole transport layer HTL.

The second, fourth, and sixth auxiliary light emission layers 413, 423 and 432 may include one of an electron transport layer ETL and an electron injection layer EIL, or may include the electron transport layer ETL and the electron injection layer EIL.

The respective ones of the first and second charge generation layers 440 and 450 include n-type layers 441 and 451 and p-type layers 442 and 452.

The OLED 401 may be a white organic light emitting diode (WOLED) that emits white light. Each of the first light emission unit 410, the second light emission unit 420, and the third light emission unit 430 may emit a light having one of red, green, and blue colors. As an example, two of the first light emission unit 410, the second light emission unit 420, and the third light emission unit 430 may emit blue light and the other thereof may emit yellow light. As another example, two of the first light emission unit 410, the second light emission unit 420, and the third light emission unit 430 may emit yellow light and the other thereof may emit blue light.

Figure 14:
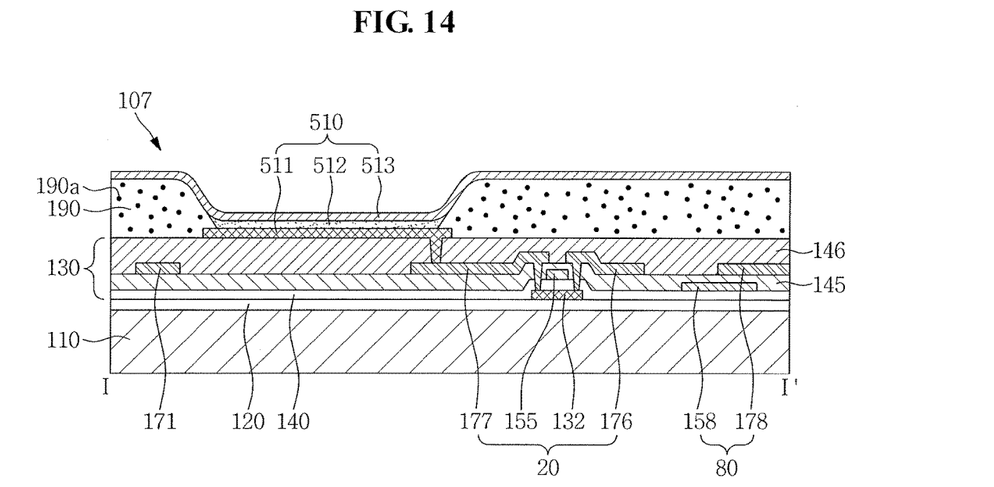
FIG. 14 illustrates another embodiment of an OLED display device.

FIG. 14 illustrates another embodiment of an OLED display device 107 which includes a substrate 110, a wiring portion 130, and an OLED 510. The OLED 510 includes a first electrode 511, an organic light emission layer 512, and a second electrode 513. In such an exemplary embodiment, the first electrode 511 is a light transmission electrode and the second electrode 513 is a reflective electrode. Accordingly, light generated in the organic light emission layer 512 is transmitted through the first electrode 511 and the substrate 110 and emitted to the outside. The OLED display device 107 may be, for example, a bottom-emission type structure.

Wirings in the wiring portion 130 and a driving TFT 20 may be arranged, for example, to reduce or substantially minimize overlap with the OLED 510, in order to substantially prevent light emitted from the organic light emission layer 512 from being disturbed.

In accordance with one or more of the aforementioned embodiments, color mixture may be reduced or substantially prevented and color purity may be improved in the OLED display device by including carbon quantum dots in the pixel defining layer of the OLED display device. In the foregoing embodiments, the quantum dots were described as carbon quantum dots. In another embodiment, the quantum dots may include a material different from and excluding carbon.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. An organic light emitting display device, comprising:
   a substrate;
   a first electrode on the substrate;
   a pixel defining layer defining a first opening that exposes at least a portion of the first electrode;
   a first organic light emission layer on the first electrode in the first opening, the first organic light-emission layer to emit light of a first color; and
   a second electrode on the first organic light emission layer, wherein the pixel defining layer adjacent to the first opening includes quantum dots that emit light of a color that is substantially the same as the first color.

2. The organic light emitting display device as claimed in claim 1, wherein the quantum dots are carbon quantum dots.

3. The organic light emitting display device as claimed in claim 1, wherein:
   the pixel defining layer includes a first pixel defining layer and a second pixel defining layer, the first pixel defining layer and the second pixel defining layer defining the first opening together, and
   the first pixel defining layer has a second opening.

4. The organic light emitting display device as claimed in claim 3, wherein at least a portion of the second pixel defining layer is at the second opening.

5. The organic light emitting display device as claimed in claim 4, wherein:
   the first pixel defining layer includes the quantum dots, and the second pixel defining layer excludes the quantum dots.

6. The organic light emitting display device as claimed in claim 5, wherein the quantum dots are carbon quantum dots.

7. The organic light emitting display device as claimed in claim 1, further comprising at least one of a hole injection layer and a hole transport layer between the first electrode and the first organic light emission layer.

8. The organic light emitting display device as claimed in claim 7, further comprising an auxiliary hole transport layer between the first electrode and the first organic light emission layer.

9. The organic light emitting display device as claimed in claim 1, further comprising at least one of an electron transport layer and an electron injection layer between the first organic light emission layer and the second electrode.

10. The organic light emitting display device as claimed in claim 9, further comprising an auxiliary electron transport layer between the first organic light emission layer and the second electrode.

11. The organic light emitting display device as claimed in claim 1, further comprising:
a capping layer on the second electrode; and
a thin film encapsulation layer on the capping layer and including:
at least one inorganic layer; and
at least one organic layer alternately arranged with the at least one inorganic layer.

12. The organic light emitting display device as claimed in claim 1, further comprising:
a capping layer on the second electrode;
a filler on the capping layer; and
an encapsulation substrate on the filler.

13. The organic light emitting display device as claimed in claim 1, further comprising a second organic light emission layer between the first organic light emission layer and the second electrode.

14. The organic light emitting display device as claimed in claim 13, wherein:
one of the first organic light emission layer and the second organic light emission layer is a blue light emission layer, and
the other of the first organic light emission layer and the second organic light emission layer is a yellow light emission layer.

15. The organic light emitting display device as claimed in claim 13, further comprising a charge generation layer between the first organic light emission layer and the second organic light emission layer.

16. The organic light emitting display device as claimed in claim 15, wherein the charge generation layer includes at least one of an n-type layer and a p-type layer.

17. A display device, comprising:
a substrate;
a first electrode and a second electrode on the substrate; and
a first pixel including an organic emission layer to emit light of a first color, a second pixel including an organic emission layer to emit light of a second color, and a third pixel including an organic emission layer to emit light of a third color, the first, second, and third colors being different from each other, wherein
a pixel defining layer adjacent to the first pixel includes quantum dots that emit light of the first color, a pixel defining layer adjacent to the second pixel includes quantum dots that emit light of the second color, and a pixel defining layer adjacent to the third pixel includes quantum dots that emit light of the third color.

18. The display device as claimed in claim 17, wherein the quantum dots include a light-absorbing material.

19. The display device as claimed in claim 17, wherein each of the quantum dots includes carbon.

20. The display device as claimed in claim 17, further comprising:
a capping layer on the second electrode;
an encapsulation layer; and
a filler between the capping layer and the encapsulation layer.

* * * * *